United States Patent [19]

Williams

[11] 4,068,278
[45] Jan. 10, 1978

[54] OVERLOAD PROTECTION CIRCUIT FOR AMPLIFIERS

[76] Inventor: Bruce T. Williams, 86 Park Lane Circle, Lockport, N.Y. 14094

[21] Appl. No.: 690,787

[22] Filed: May 27, 1976

[51] Int. Cl.² .............................................. H02H 7/20
[52] U.S. Cl. ........................................ 361/56; 361/91; 330/207 P
[58] Field of Search .................... 317/16, 31, 33 R; 330/207 P; 307/202 R, 317 R, 318; 361/56, 88, 91

[56] References Cited

U.S. PATENT DOCUMENTS

| 3,200,346 | 8/1965 | Young | 330/207 P |
| 3,712,995 | 1/1973 | Steudel | 307/202 X |
| 3,979,642 | 9/1976 | Cath et al. | 317/16 |

Primary Examiner—J D Miller
Assistant Examiner—Patrick R. Salce
Attorney, Agent, or Firm—Christel & Bean

[57] ABSTRACT

An overload protection circuit for an amplifier including a first voltage responsive protection network in the form of a pair of back-to-back ordinary diodes connected to the amplifier input, a second voltage responsive protection network including diodes connected between the first protection network and the circuit reference or ground, and a feedback path between the amplifier output and the junction of the first and second protection networks for applying to the junction a voltage of the same magnitude and polarity as that applied to the amplifier input during non-overload conditions to prevent or minimize loading on the amplifier input by the first protection network. The circuit operates with no bias applied to the first protection network to prevent leakage current flow into the amplifier.

7 Claims, 3 Drawing Figures

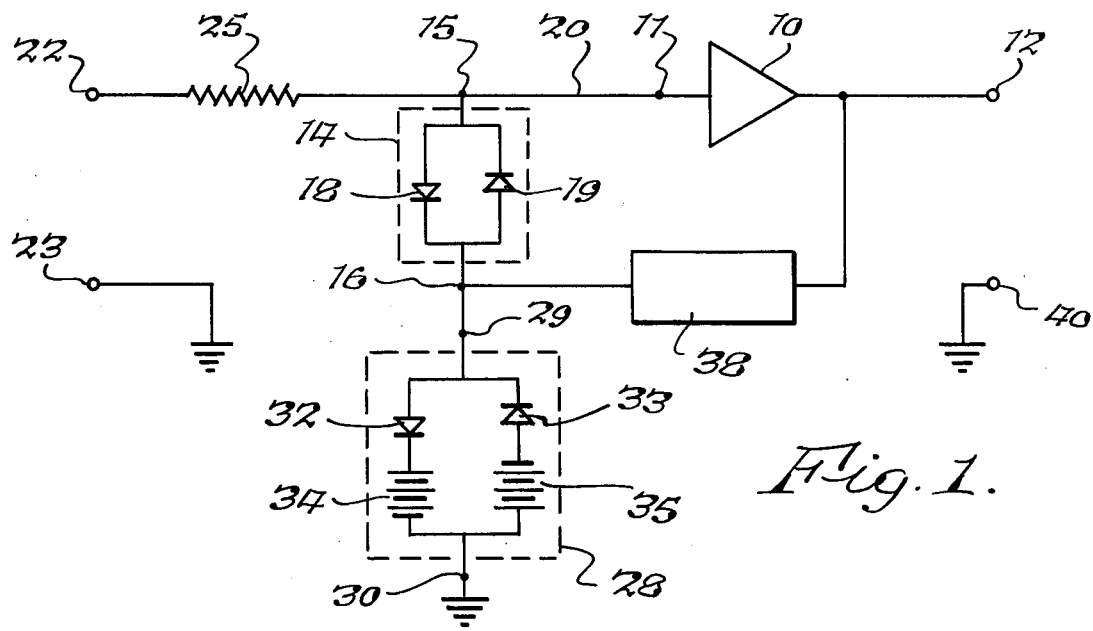
Fig. 1.
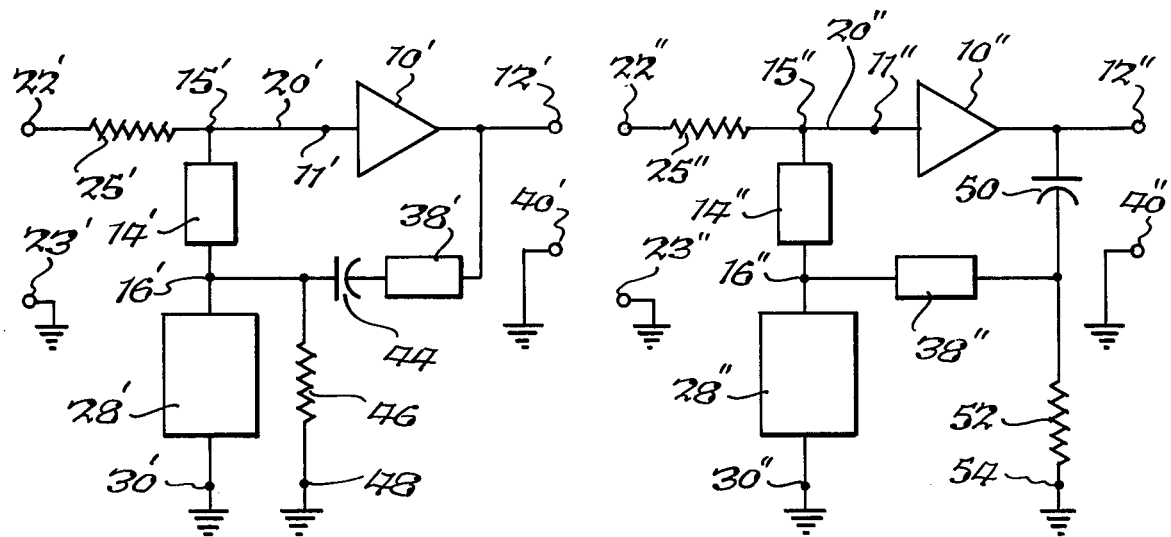
Fig. 2.
Fig. 3.

OVERLOAD PROTECTION CIRCUIT FOR AMPLIFIERS

BACKGROUND OF THE INVENTION

This invention relates to the art of overload protection circuits for amplifiers, and more particularly to a new and improved overload protection circuit operating at low power and providing little or no loading effect on the amplifier being protected.

One area of use of the present invention is providing overload protection for amplifiers employing destructible elements such as field effect transistors and integrated circuit components, although the principles of the present invention can be variously applied. An overload protection circuit functions to limit the amplifier to operating potentials which do not exceed the destruction potentials of the amplifier elements. Among the various factors to be considered in designing such a circuit are low power operation, negligible loading on the amplifier being protected, and simple construction.

SUMMARY OF THE INVENTION

It is therefore an object of the present invention to provide a new and improved overload protection circuit for amplifiers.

It is a further object of the present invention to provide such an overload protection circuit which operates at relatively low power.

It is a further object of the present invention to provide such an overload protection circuit which imposes little or no loading effect on the amplifier being protected.

It is a further object of the present invention to provide such an overload protection circuit which prevents introduction of leakage currents into the amplifier being protected.

It is a further object of the present invention to provide such an overload protection circuit which is highly effective in operation yet simple in construction.

The present invention provides an overload protection circuit for an amplifier including first voltage responsive means connected to the amplifier input and operable to define an electrical short circuit when a voltage of predetermined magnitude is applied thereacross and second voltage responsive means connected between the first means and the circuit ground or reference and operable to define an electrical short circuit when a voltage of predetermined magnitude is applied thereacross. The first means operates at relatively low power, and the voltage causing the second means to operate is substantially greater in magnitude as compared to the voltage causing the first means to operate. A feedback path connected between the amplifier output and the junction between the first and second voltage responsive means functions to apply to the junction a voltage of the same magnitude and polarity as the voltage applied to the amplifier input during non-overload conditions to impose little or no loading effect on the amplifier input. The circuit is operated with no bias applied to the first voltage responsive means to prevent leakage current flow into the amplifier.

The foregoing and additional advantages and characterizing features of the present invention will become clearly apparent upon a reading of the ensuing detailed description together with the included drawing wherein:

BRIEF DESCRIPTION OF THE DRAWING FIGURES

FIG. 1 is a schematic circuit drawing of an overload protection circuit for amplifiers according to the present invention;

FIG. 2 is a schematic diagram of an overload protection circuit for amplifiers according to another embodiment of the present invention; and FIG. 3 is a schematic diagram of an overload protection circuit for amplifiers according to another embodiment of the present invention.

DETAILED DESCRIPTION OF THE ILLUSTRATED EMBODIMENTS

Referring now to FIG. 1, a conventional amplifier 10 has an input terminal 11 and an output terminal 12. The overload protection circuit of the present invention comprises first voltage responsive protection means designated 14 having a pair of terminals or ports 15, 16 and normally presenting an open circuit between the ports 15, 16 and operative to present a closed or short electrical circuit between terminals 15, 16 when a voltage of a predetermined magnitude or amplitude is applied across the terminals 15, 16. In other words, protection means 14 normally provides an extremely high or nearly infinite resistance between terminals 15, 16 until the voltage of predetermined magnitude is applied thereacross whereupon the resistance becomes very negligible or practically zero between terminals 15, 16. The protection means 14 is operative with voltages of both positive and negative polarity, and one form comprises a network including a pair of conventional silicon diodes 18, 19 connected in a back-to-back arrangement. In particular, the anode of diode 18 is connected to port 15 and the cathode thereof is connected to port 16. Diode 19 is connected electrically in parallel with diode 18, and the anode of diode 19 is connected to port 16 and the cathode thereof is connected to port 15. Port 15 of the protective network 14 is connected through a lead 20 to the amplifier input terminal 11.

An input electrical signal quantity to be amplified by amplifier 10 is applied to a pair of circuit input terminals 22, 23. Terminal 22 is connected through a protective resistor 25 to the port 15, and terminal 23 is connected to the circuit electrical ground or reference point of the circuit.

The overload protection circuit according to the present invention further comprises second voltage responsive protection means designated 28 having a pair of terminals or ports 29, 30. Terminal 29 is connected to terminal 16 of network 14, and terminal 30 is connected to the circuit electrical ground or reference point. The second protection means functions to present an open circuit between the ports 29, 30 during normal operation and to present a closed or short electrical circuit between the ports 29, 30 when a voltage of a predetermined magnitude or amplitude is applied across the ports 29, 30. In other words, protection means 28 normally provides an extremely high or nearly infinite resistance between terminals 29,30 until the voltage of predetermined magnitude is applied thereacross whereupon the resistance becomes very negligible or practically zero between the terminals 29,30. The protection means 28 is operative with voltages of both positive and negative polarities, and one form comprises a network including a pair of ordinary diodes 32, 33 connected in oppositely poled relationship and each having a source of reverse bias in the form of batteries 34, 35. As shown in FIG. 1, the anode of diode 32 is connected to port 29 and the cathode thereof is connected to the positive terminal of a d.c. bias source or battery 34, the negative terminal of which is connected to port 30. The cathode of diode 33 is connected to port 29 and the anode thereof is connected to the negative terminal of a d.c. bias source or battery 35, the positive terminal of which is connected to port 30.

The overload protection circuit of the present invention further comprises means generally designated 38 for providing a feedback path from the output of amplifier 10 to the other port 16 of the first protection means, i.e., the port which is connected to the second protection means 28, to drive the other port of the first protection means to the same potential as that applied to the amplifier input terminal 11 during non-overload conditions. In the general case where amplifier 10 has gain of G, the feedback element 38 has a gain of 1/G and can be in the form of an amplifier or, alternatively, could include passive circuit elements or networks. The feedback provided by the path including the component 38 causes the first protection network 14 including diodes 18, 19 to have little or no loading effect on the input circuit of amplifier 10 when the input signals are within the normal operating range in a manner which will be described in detail presently. The amplified output signal provided by amplifier 10 is obtained between amplifier output terminal 12 and a terminal 40 connected to the electrical ground or reference for the circuit.

The circuit of FIG. 1 operates in the following manner. Amplifier 10 typically is of the type employing input elements such as field effect transistors and MOSFET or other semiconductor devices as well as integrated circuit components which are susceptible to overvoltage damage from input circuit transients. During normal operation, that is in the absence of any overload voltages including fast rise time transients applied to input terminals 22, 23 or output terminals 12, 40, the first and second protection means 14 and 28, respectively, behave electrically as open circuits. Accordingly, an input signal applied across terminals 22, 23 is applied through resistor 25 to the amplifier input terminal 11, and the amplified version is present on the amplifier output terminal 12 and referenced to the ground or reference terminal 40. The output of amplifier 10 is applied to feedback component 38 which functions to apply to the port 16 a signal equal in amplitude or magnitude to the signal applied to amplifier input 11 and of the same polarity. In the general case where amplifier 10 has a gain of G, the component 38 of the feedback path has a gain of 1/G. As a result, with the same voltage being applied to each of the ports 15, 16 the voltage difference or net voltage applied across the ports 15, 16, i.e., across the protection network 14 comprising the back-to-back diodes 18 and 19, is zero. The diodes 18, 19 are maintained non-conducting so that they behave electrically as an open circuit. Also, so long as the voltage applied to port 16 is less than the predetermined voltage which would cause conduction of diodes 32, 33, the protection 28 continues to behave electrically as an open circuit.

The protection means 28 functions to limit the voltage or potential level to which the feedback path including element 38 can drive the port 16. In the circuit illustrated in FIG. 1, the combination of the source of d.c. bias voltage or battery 34 together with diode 32 imposes a positive voltage limit upon the port 16, and the combination of the d.c. bias source or battery 35 and diode 33 imposes a negative voltage limit on the port 16. Assuming diodes 32, 33 both to be of the ordinary silicon junction type having a junction potential of about 0.5 volts, i.e., requiring a forward voltage greater than 0.5 volts for conduction, if batteries 34 and 35 each provide 9 volts, then the application of a positive or negative voltage at port 16 having an amplitude greater than 9.5 volts will cause one of the diodes 32, 33 to conduct with the result that the protection means 28 will behave electrically as a short circuit thereby connecting the port 16 directly to the ground or reference terminal 30.

The voltage difference or net voltage applied across ports 15, 16 which will cause the first protection means 14 to behave as an electrical short circuit typically will be of substantially smaller magnitude as compared to the voltage causing operation of the second protection means 28. In the circuit of FIG. 1, diodes 18 and 19 each are of the ordinary silicon type having a junction potential of about 0.5 volts thereby requiring a forward voltage greater than 0.5 volts for conduction. Thus, whenever the voltage difference or net voltage between the ports 15, 16 exceeds approximately 0.5 volts, regardless of the relative polarity, the protection means 14 will behave electrically as a short circuit thereby connecting the ports 15, 16 directly together.

The overload voltage is determined by the destruction potential of amplifier 10 and its components. The second protection means 28 is constructed or adjusted to switch or change state from an open circuit to a closed circuit at an applied voltage, i.e., overload voltage, which is selected below the amplifier destruction potential. When the feedback path including element 38 applies a voltage to the port 16 which is equal to or greater than the predetermined overload voltage, one of the diodes 32 or 33 will conduct, depending upon the polarity of applied voltage, thereby defining an electrical short circuit between the port 16 and the electrical ground or reference terminal 30. When this occurs, a voltage also will appear across the ports 15 and 16, i.e., across the first protection means 14 including the back-to-back diodes 18, 19. This voltage is the difference between the voltage limit level imposed by the protection means 28 on the port 16 and the level of the input voltage appearing on port 15. When this difference in voltage or net voltage applied across the ports 15, 16 reaches the voltage limit imposed by the protection means 14, i.e., the junction potential of either diode 18 or 19, one of the diodes will conduct depending upon the relative polarity thereby creating an electrical short circuit between the ports or terminals 15, 16. As a result, since network 28 already has established an electrical short circuit between terminals 29 and 30, the amplifier input terminal 11 is connected by an extremely low resistance path, in effect a short circuit, to the ground or reference at terminal 30 thereby limiting the voltage appearing at the amplifier input terminal 11 to a value less than the destructive potential of the amplifier and its components.

Resistor 25 is provided to limit the current flow through the diodes 18, 19, 32 and 33 during overload conditions. In the foregoing illustration the protective network 28 performed its limiting function prior to that of the protective network 14, but an extremely fast rise time transient appearing at the port 15 would cause immediate conduction of either diode 18, 19 to protect the amplifier input terminal 11 from such transient.

One advantage of the overload protection circuit of the present invention is that it imposes little or no loading effect on the amplifier being protected. To cause the protection means 14 including the back-to-back diodes 18, 19 to have little or no loading effect on the amplifier input circuit when the input signals are within the normal operating range, feedback is employed by means of the component 38 to effectively drive the junction of the first protection means 14 and the second protection means 28 to a potential having a magnitude equal to the amplitude of the input signal. This bootstrapping technique effectively holds the voltage across the back-to-back diodes 18, 19 at zero until limiting is required. By holding the voltage across diodes 18, 19 at zero, any loading effect the diodes would tend to have on the amplifier input circuit is minimized or eliminated. Furthermore, this allows the maximum voltage applied to the amplifier input circuit to be greater than the junction potential of the diodes 18, 19 which junction potential is in the neighborhood of 0.5 volts positive and negative for ordinary silicon diodes.

The overload protection circuit of the present invention is advantageous for use with an amplifier of the voltage follower type where it is desired that the amplifier input impedence be relatively high. The bootstrapping potential applied to port 16 by the feedback circuit 38 reduces the effective change of voltage across diodes 18, 19 to near zero thereby causing the effective impedence of the diodes to increase by the ratio of the non-feedback voltage change to the feedback voltage change. In a typical follower circuit, the output follows the input to within 99.98 percent, and this causes the output, which is feedback, to be within 0.02 percent of the input for all normal input signal levels. Accordingly, this would effectively increase the impedance of the protective diodes 18, 19 by a factor of 5000.

Another advantage of the overload protection circuit of the present invention is that the first voltage responsive protection means 14 which is connected to the amplifier input has a relatively low power rating. In particular, the protection means 14 includes ordinary semiconductor diodes 18, 19, such as silicon junction diodes, which are low power devices. These diodes have a relatively low voltage drop across them when the amplifier output is clamped and continues to rise. Alternatively, diodes 18 and 19 each could be substituted by a transdiode which is a transistor connected as a diode, i.e., the transistor base is connected directly to the collector, and the collector-emitter pass is poled in the same manner as the corresponding one of the diodes 18, 19. Transdiodes have the advantage of presenting relatively lower leakage and lower capacitance in the non-conducting mode. A further alternative would be field effect transistor type diodes connected back-to-back like the silicon diodes 18 and 19, and diodes of this type have the advantage of relatively lower leakage and capacitance.

In the voltage responsive protection means 28 shown in FIG. 1, since the junction potentials of the diodes 32, 33 are fixed or permanent, by changing the magnitudes of the batteries or sources 34, 35 the positive and negative voltage limits can be changed. Other elements could be substituted to effect the voltage limiting action of the network 28 such as Zener diodes, varistors, or similar devices. For example, battery 34 could be replaced by a Zener diode having the cathode thereof connected to the cathode of diode 32, and battery 35 could be replaced by a Zener diode having the anode thereof connected to the anode of diode 33. Alternatively, the entire circuit 28 could be replaced by two Zener diodes connected in series opposition between port 16 and the electrical ground or reference at terminal 30.

The overload protection circuit of the present invention is highly effective in operation yet simple in construction and includes components which are extremely reliable and long-lasting.

Another important characteristic of the overload protection circuit of the present invention is that there is no bias voltage applied to the first voltage responsive protection means 14 comprising the back-to-back diodes 18, 19. Operating the diodes 18, 19 with zero bias insures that no leakage current can be injected into the input of amplifier 10 through the protective diodes. If the amplifier 10 is used in a.c. amplifications where the input signal does not contain d.c. components, the feedback path including component 38 need only drive the port 16 to the same potential as the input of amplifier 10 just at the frequency of interest. In these situations capacitive coupling can be employed in the feedback path as shown in FIGS. 2 and 3. In the circuit of FIG. 2, the components thereof which are identical to the components of FIG. 1 are given the same reference numeral and provided with a prime designation. A coupling capacitor 44 is provided in the feedback path between the components 38' and port 16'. In particular, one terminal of capacitor 44 is connected to the feedback component 38', and the other terminal of capacitor 44 is connected to port 16' and to one terminal of a resistor 46, the other terminal of which is connected to a terminal 48 connected to the electrical reference or ground. Capacitor 44 provides a.c. coupling in the feedback path to prevent any application of bias voltage to port 16'. In the circuit of FIG. 3 components thereof which are identical to components of FIG. 1 are provided with the same reference numerals but with a double prime designation. A coupling capacitor 50 is included in the feedback path of amplifier 10" between the amplifier output and the feedback component 38". In particular, one terminal of capacitor 50 is connected to the amplifier output, and the other terminal is connected to the feedback component 38" and to one terminal of a resistor 52, the other terminal of which is connected to a terminal 54 connected to the electrical ground or reference. Capacitor 50 provides a.c. coupling in the feedback path to prevent application of bias voltage to port 16".

In situations where the signal applied to input terminal 22 is an a.c. signal having a d.c. component, or where it is a pure d.c. signal, amplifier 10 and feedback component 38 will be d.c. coupled elements. In all situations, the bandwidth characteristics of amplifier 10 and feedback component 38 will be selected to be consistent with the frequencies of interest in the input signal.

It is therefore apparent that the present invention accomplishes its intended objects. While several embodiments of the present invention have been described in detail, this is for the purpose of illustration, not limitation.

I claim:

1. An overload protection circuit for an amplifier having an input and an output comprising:
   a. first voltage responsive protection means having a pair of ports and normally providing a relatively high resistance path between said ports and operative to provide a relatively low resistance path between said ports when a voltage of predetermined magnitude is applied across said ports;

b. means for connecting one of said ports of said first protection means to said input of said amplifier;

c. second voltage responsive protection means connected to said other port of said first protection means and normally providing a relatively high resistance path and operative to provide a relatively low resistance path when a voltage of predetermined magnitude is applied thereacross; and d. means including frequency responsive means defining a feedback path from said output of said amplifier to said other port of said first protection means for driving said port to a potential equal in magnitude and polarity to the potential applied to said amplifier input during non-overload conditions.

2. Apparatus according to claim 1, further including means operatively connected to said first protection means for preventing application of bias voltage to said first protection means.

3. Apparatus according to claim 1, wherein said second protection means provides said low resistance path in response to a voltage applied thereacross of a magnitude several times greater than the voltage causing said first protection means to provide said low resistance path.

4. Apparatus according to claim 1, wherein said first protection means operates at a power level considerably lower than the power level of said second protection means.

5. Apparatus according to claim 1, wherein said first protection means comprises a pair of ordinary semiconductor diodes in back-to-back relation between said ports.

6. Apparatus according to claim 1, wherein said second protection means is connected between said other port of said first protection means and an electrical ground or reference.

7. An overload protection circuit for an amplifier having an input and an output comprising:

a. first voltage responsive protection means having a pair of ports and normally providing a relatively high resistance path between said ports and operative to provide a relatively low resistance path between said ports when a voltage of predetermined magnitude is applied across said ports;

b. means for connecting one of said ports of said first protection means to said input of said amplifier;

c. second voltage responsive protection means connected to said other port of said first protection means and normally providing a relatively high resistance path and operative to provide a relatively low resistance path when a voltage of predetermined magnitude is applied thereacross;

d. means defining a feedback path from said output of said amplifier to said other port of said first protection means for driving said port to a potential equal in magnitude and polarity to the potential applied to said amplifier input during non-overload conditions; and e. capacitive coupling means in said feedback path for preventing application of bias voltage to said first protection means.

* * * * *